United States Patent [19]

Slobodnik, Jr.

[11] 4,001,767
[45] Jan. 4, 1977

[54] LOW DIFFRACTION LOSS-LOW SPURIOUS RESPONSE LiTaO₃ SUBSTRATE FOR SURFACE ACOUSTIC WAVE DEVICES

[75] Inventor: Andrew J. Slobodnik, Jr., Malden, Mass.

[73] Assignee: The United States of America as represented by the Secretary of the Air Force, Washington, D.C.

[22] Filed: Nov. 18, 1975

[21] Appl. No.: 633,070

[52] U.S. Cl. .................... 310/9.5; 333/30 R
[51] Int. Cl.² .......................... H01L 41/08
[58] Field of Search ........... 310/8, 9.5, 9.6, 9.7, 310/9.8; 333/30 R, 72

[56] References Cited
UNITED STATES PATENTS

| | | | |
|---|---|---|---|
| 3,461,408 | 8/1969 | Onoe et al. | 310/9.5 |
| 3,525,885 | 8/1970 | Ballman et al. | 310/9.5 |
| 3,601,639 | 8/1971 | Hannon | 310/9.5 |
| 3,644,761 | 2/1972 | Dol et al. | 310/9.5 |

*Primary Examiner*—Mark O. Budd
*Attorney, Agent, or Firm*—Joseph E. Rusz; Willard R. Matthews, Jr.

[57] ABSTRACT

The particular anisotropy of a specific propagation surface orientation on a single crystal lithium tantalate substrate member is utilized to achieve low diffraction, low spurious response surface acoustic wave (SAW) propagation. The preferred embodiment utilizes a propagation surface that substantially coincides with a plane defined by the Euler angles Lambda = 0°, Gamma = 166.65 (+0, −0.3)°, and Theta = 90°.

1 Claim, 7 Drawing Figures

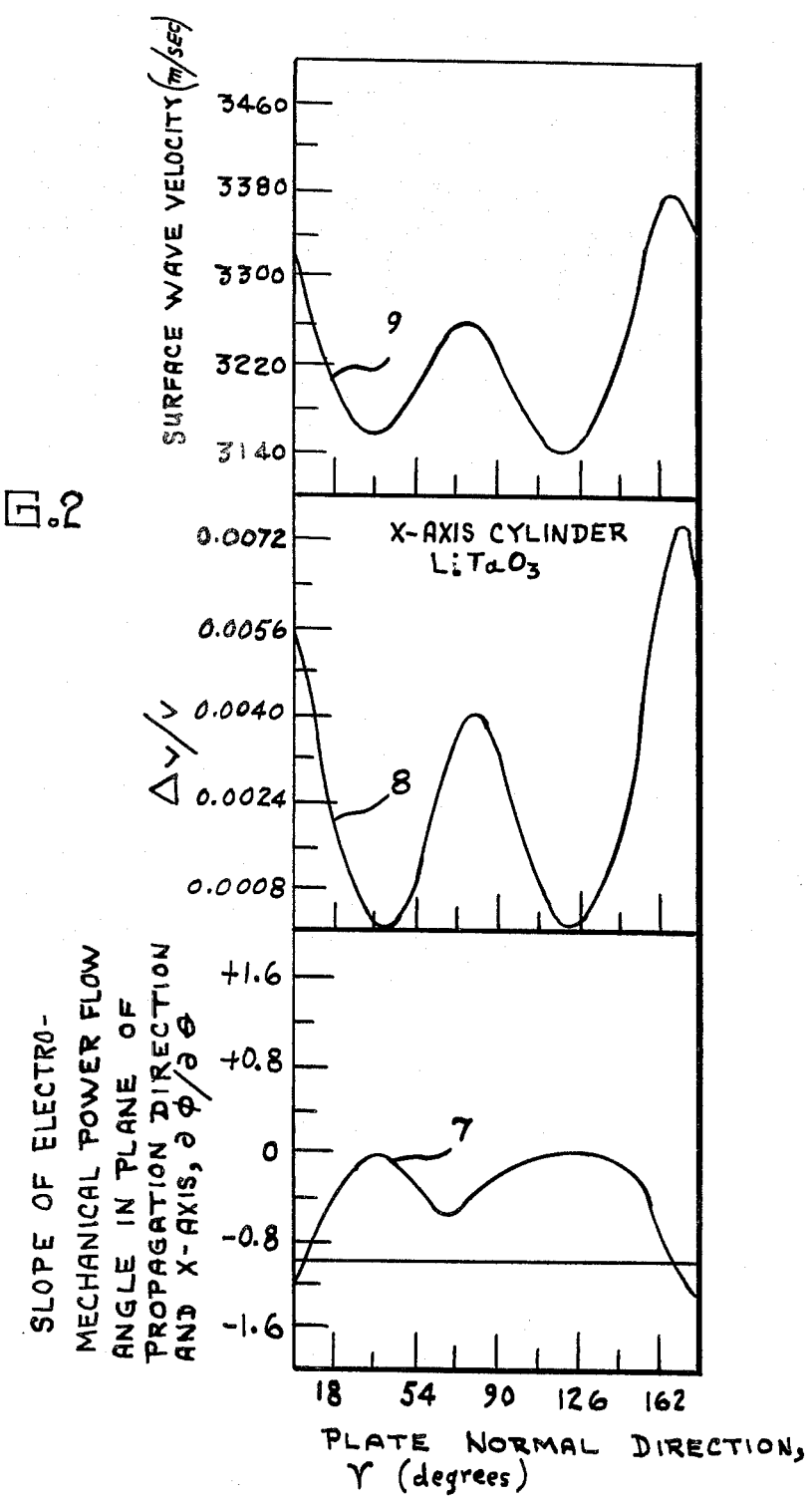

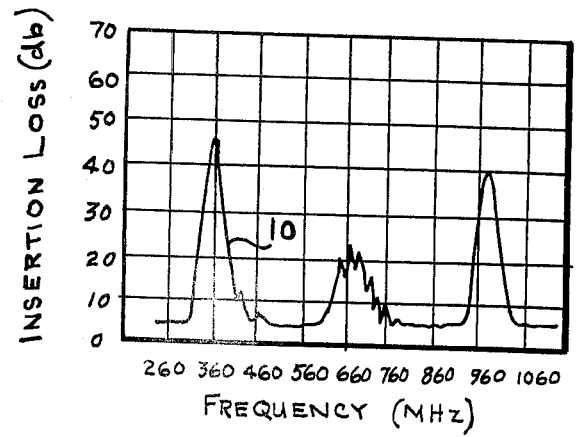
FIG. 4 — CONVENTIONAL SUBSTRATE YZ LITHIUM TANTALATE
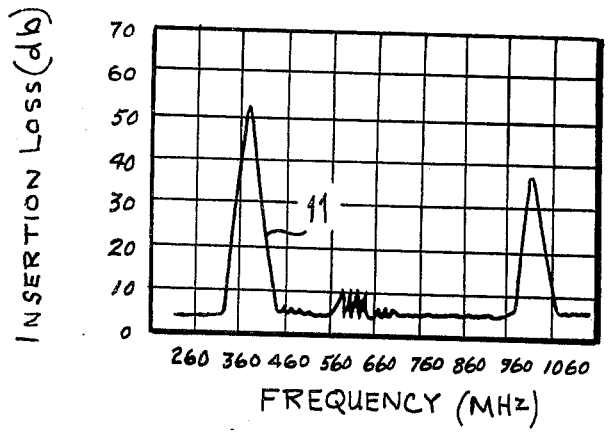
FIG. 5 — MINIMAL DIFFRACTION CUT (MDC) LITHIUM TANTALATE

LOW DIFFRACTION LOSS-LOW SPURIOUS RESPONSE LITAO₃ SUBSTRATE FOR SURFACE ACOUSTIC WAVE DEVICES

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave device substrate members, and in particular to the reduction of beam spreading and spurious response in various surface acoustic wave devices.

Surface acoustic wave filters and delay lines can be used to substantial advantage to replace electronic filters and to provide ultra long time delays in ECM and other electronic systems where small size, inexpensive, reliable, reproducible devices are needed. However, diffraction losses (losses due to beam spreading) tend to reduce the efficiency of surface acoustic wave delay lines and filters. The design of such filters becomes difficult when highly apodized transducers are required. Apodized transducers, that is, those having minimum and variable overlap between adjacent interdigital transducer fingers, produce very complex acoustic surface wave diffraction patterns. Design of such devices requires precise knowledge of diffraction losses. Beam spreading, therefor, represents a serious problem with respect to both device design and device efficiency. Commonly used substrate materials employing known surface wave propagation surface cuts often produce surface acoustic wave devices that are subject to excessive diffraction, low coupling coefficient characteristics and high spurious responses. Substantial improvement therefore can be realized in surface acoustic wave devices such as filters, delay lines and the like by improving the surface acoustic wave substrate members. For instance, an ideal surface acoustic wave filter would be approached by using a substrate whose material and propagation surface cut would effect the combination of low diffraction, low spurious response, high coupling, coefficient at high velocity. The present invention is directed toward accomplishing these ends.

SUMMARY OF THE INVENTION

The invention is based on the discovery that a certain propagation surface cut on single crystal lithium tantalate (LiTaO₃) produces an acoustic surface wave device substrate member having markedly improved spurious response and diffraction loss characteristics. Significant improvement is achieved if the propagation surface cut coincides with a plane defined by Euler angles Lambda = 0°, Gamma = 166.65 (+0, −0.3)°, and Theta = 90°.

It is a principal object of the invention to provide a new and improved substrate member for surface acoustic wave devices.

It is another object of the invention to provide a surface acoustic wave device substrate member having greatly improved diffraction loss characteristics.

It is another object of the invention to provide a surface acoustic wave filter substrate having the combined attributes of low diffraction, low spurious response, high coupling coefficient and high surface wave velocity.

It is another object of the invention to provide a substrate member that will improve the efficiency and facilitate the design of highly apodized surface acoustic wave filters.

These, together with other objects, features and advantages, will become more readily apparent from the following detailed description when taken in conjunction with the illustrative embodiment in the accompanying drawings.

DESCRIPTION OF THE DRAWINGS

FIG. 2 illustrates curves of surface wave velocity, coupling parameters, and slope of electromechanical power flow angle for an LiTaO₃ substrate member for propagation surfaces defined by Euler angle Lambda = 0°, Gamma = 166.65(+0, −0.3)°, and Theta = 90°;

FIG. 4 illustrates an experimental spectrum analyzer response plot of a surface acoustic wave Butterworth filter fabricated on a YZ cut LiTaO₃ substrate; and Filter 5 illustrates an experimental spectrum analyzer response plot of a surface acoustic wave Butterworth filter fabricated on an LiTaO₃ substrate having its propagation surface cut as described by the present invention.

DETAILED DESCRIPTION OF THE PREFERRED EMBODIMENT

Due to its high surface acoustic wave velocity and good coupling coefficient, single crystal lithium tantalate (LiTaO₃) offers high frequency, low insertion loss surface acoustic wave filters and other signal processing devices in exceedingly compact packages. Design of such devices, particularly when they are highly apodized, however, requires precise knowledge of diffraction losses. It is also necessary that such devices be designed to have excellent spurious response suppression characteristics. The present invention comprehends a substrate member having an acoustic wave propagation surface that provides a factor of 20 less diffraction than isotropic cases plus inherent spurious response suppression of the order of 35 db.

Although an exact theoretical description of surface wave diffraction in anisotropic media is quite formidable, many materials can be quantitatively very accurately modeled using an approximate parabolic theory. Within the limits of this theory the diffraction spreading is the same as that for isotropic media but is scaled by the factor $|1 + \delta \phi / \delta \theta|$ where $\delta \phi / \delta \phi$ is the slope of the electromechanical power flow angle. Ideally, then, no diffraction spreading for parabolic surfaces occurs when $\phi / \theta = -1$.

Figure 1:
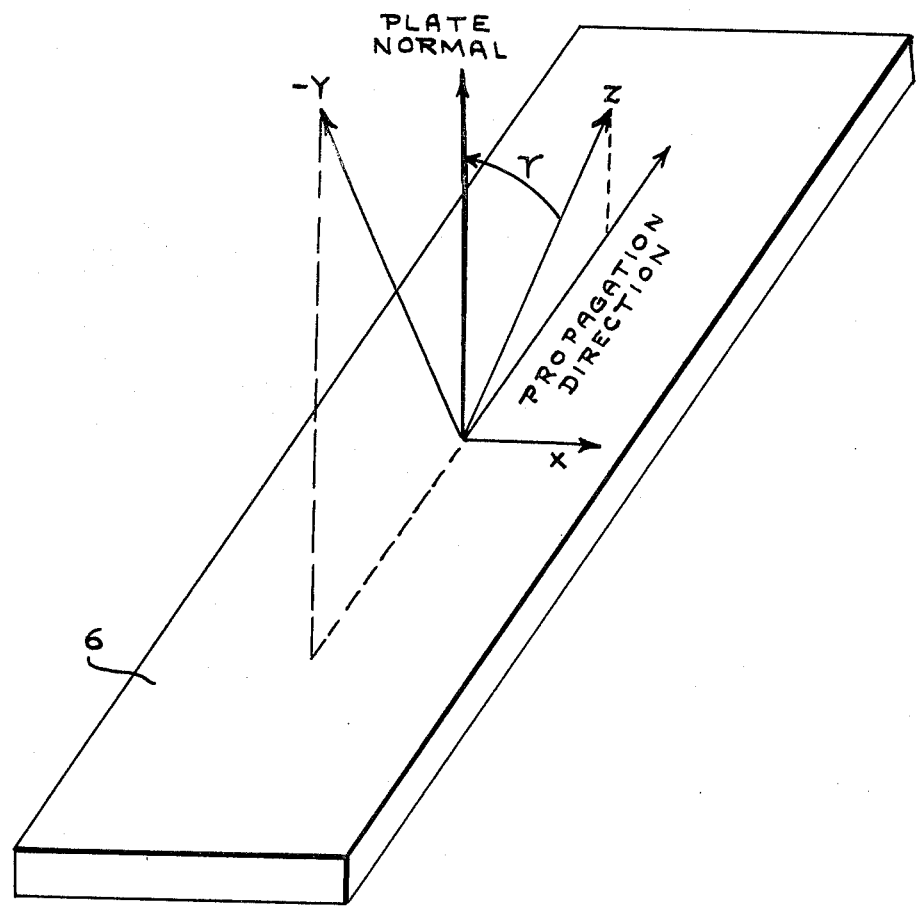
FIG. 1 illustrates a surface acoustic wave device substrate member of the type comprehended by the invention.

A certain surface acoustic wave propagation surface cut on single crystal lithium tantalate has been discovered that satisfies this condition. FIG. 1 illustrates a LiTaO₃ substrate member 6 together with crystallographic axes and Euler angle notations. Optimum diffraction loss characteristics are obtained if the propagation surface substantially coincides with a plane defined by Euler angles Lambda = 0°, Gamma = 166.65(+0 −0.3)°, and Theta = 90°.

Figure 3A:
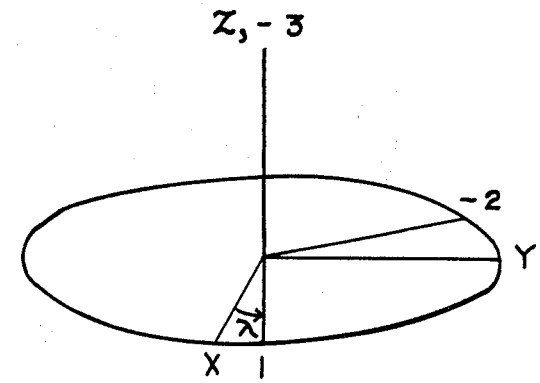
FIGS. 3a, 3b and 3c illustrate the coordinate system used to define acoustic surface wave propagation in terms of Euler angles.
Figure 3B:
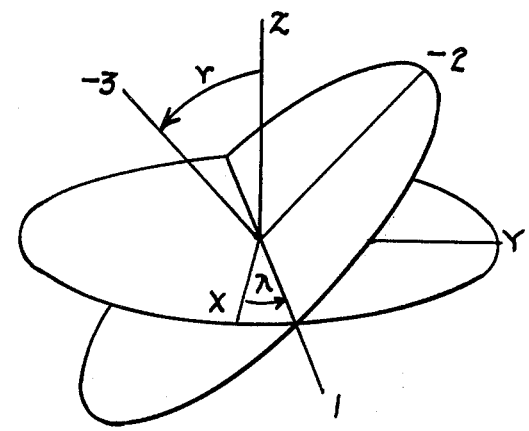
Figure 3C:
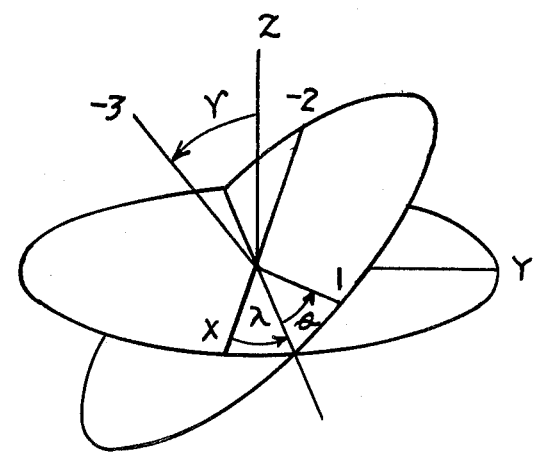

The coordinate system used to define acoustic surface wave propagation in terms of Euler angles is illustrated by FIGS. 3a, 3b, and 3c. The phase velocity vector lies along the 1 axis while the plane normal lies along the negative 3 axis. The crystalline axes are given by X, Y and Z, while the Euler angles are Lambda, Gamma and Theta. FIGS. 3a, 3b and 3c illustrate the standard starting coordinate system in which the propagation axes lineup with the crystalline X, Y and Z axes. It follows therefore that the standard Euler angle rotation Lambda = 0°, Gamma 166.65(+0−0.3)°, Theta = 90° specified above refers to rotation in a plane perpendiculaar to the X axis and starting with a propagation direction along the Y axis and a plane normal along the Z axis.

FIG. 2 illustrates curves of surface wave velocity (curve 9), coupling parameters (curve 8) and slope of electromechanical power flow angle (curve 7) for the substrate member 6 of FIG. 1.

The data plotted in FIG. 2 was obtained by varying the Gamma Euler angle from 0° − 180° while holding the Lambda Euler angle at 0° and Theta Euler angle at 90°. This is shown in FIG. 1 and is called an X-axis cylinder rotation.

As seen in FIG. 2, the slope of the power flow angle does in fact theoretically go through the −1 point at Euler angles of 0°, 6.38°, 90°, and 0°, 168.53°, 90°. The velocity and coupling parameter curves 8 and 9 given in FIG. 2 provide further important design information. Although indicating the general range of angles the theory used did not predict the exact −1 crossing point. This was determined by an extensive experimental study, the final results of which indicated a lithium terltalate substrate having an acoustic wave propagation surface cut at Euler angles 0°, 166.65 (+0 − 0.3)°, 90°; diffraction suppression equal to a factor of twenty over isotropic devices, and a surface wave velocity of 3370 m/sec. The low angle (6.38°) minimal diffraction substrate had poor spurious responses and was discarded as not exhibiting significant spurious response improvement over conventional devices. However, the excellent spurious rejection of the 0°, 166,65°, 90° cut is indicated by comparision of curve 11 of FIG. 5 with a conventional YZ lithium tantalate substrate illustrated by curve 10 of FIG. 4.

The substrate member of the invention has been demonstrated to have the following advantages over conventional YZ lithium tantalate substrates:

1. 16 times less diffraction 20 times less than isotropic cases);
2. higher coupling coefficients ($\Delta V/v = 0.0075$ vs. 0.0033;) and
3. lower spurious responses (35 db suppression vs. 22 db.)

The substrate member of the invention also has been demonstrated to have the following advantages over 40.04° bismuth germanium oxide minimal diffraction substrate:

1. higher velocity allowing higher frequenices (3370 vs 1827 m/sec);
2. higher coupling coefficients ($\Delta V/v = 0.0075$ vs 0.0031);
3. lower spurious responses (35 db suppression vs 22 db); and
4. due to the fact that lithium tantalate is not etch sensitive the invention provides a device that is much easier to fabricate.

While the invention has been described in its preferred embodiment, it is understood that the words which have been used are words of description rather than words of limitation and that changes within the purview of the appended claims may be made without departing from the scope and spirit of the invention in its broader aspects.

What is claimed is:

1. A surface acoustic wave device substrate member of single crystal lithium tantalate having an acoustic surface wave propagation surface defined by a plane that substantially coincides with the Euler angles Lambda = 0°, Gamma = 166.65(+0, −0.3)° and Theta = 90°.

* * * * *